(12) United States Patent
Koga

(10) Patent No.: US 7,382,679 B2
(45) Date of Patent: Jun. 3, 2008

(54) SEMICONDUCTOR MEMORY DEVICE

(75) Inventor: Toshiro Koga, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 179 days.

(21) Appl. No.: 11/333,233

(22) Filed: Jan. 18, 2006

(65) Prior Publication Data
US 2006/0158955 A1 Jul. 20, 2006

(30) Foreign Application Priority Data
Jan. 19, 2005 (JP) ............................. 2005-011628
Nov. 15, 2005 (JP) ............................. 2005-330718

(51) Int. Cl.
G11C 8/00 (2006.01)
(52) U.S. Cl. .................... 365/233; 365/189.04
(58) Field of Classification Search .............. 365/233, 365/189.04, 149
See application file for complete search history.

(56) References Cited
U.S. PATENT DOCUMENTS 6,269,050 B1* 7/2001 Kwon et al. ................ 365/233
6,349,072 B1* 2/2002 Origasa et al. ............. 365/233
6,489,819 B1* 12/2002 Kono et al. ................. 327/141
2002/0131320 A1* 9/2002 Kurjanowicz et al. ...... 365/233

FOREIGN PATENT DOCUMENTS

| JP | 04-326270 | 11/1992 |
| JP | 10-055673 | 2/1998 |
| JP | 2000-040370 | 2/2000 |

* cited by examiner

Primary Examiner—Anh Phung
(74) Attorney, Agent, or Firm—McGinn IP Law Group, PLLC

(57) ABSTRACT

Disclosed is a semiconductor memory device which comprises an internal clock generating circuit receiving a clock signal from outside to generate an internal clock signal to be supplied to a random access memory. The internal clock generating circuit includes a circuit for canceling internal clock generation for generating a signal activating an internal clock signal during operation based on an external clock signal, a chip select signal and a write enable signal, and a circuit for setting the internal clock signal based on an output of the circuit for canceling internal clock generation and for resetting the internal clock signal based on an internal clock reset signal. A dummy cycle is provided next to a write cycle.

13 Claims, 14 Drawing Sheets

FIG. 9

CYCLE CHARACTERISTICS OF GENERAL SYNCHRONOUS RAM IN 130 nm GENERATION

| CHARACTERISTIC RAM CAPACITY | WRITE CYCLE [ns] | READ CYCLE [ns] | DIFFERENCE IN CHARACTERISTICS |
|---|---|---|---|
| 144Kbits | 3.2 | 3.0 | 6% (DIFFERENCE 200ps) |
| 288Kbits | 4.5 | 4.0 | 11% (DIFFERENCE 500ps) |
| 576kbits | 7.1 | 6.0 | 15% (DIFFERENCE 1.1ns) |

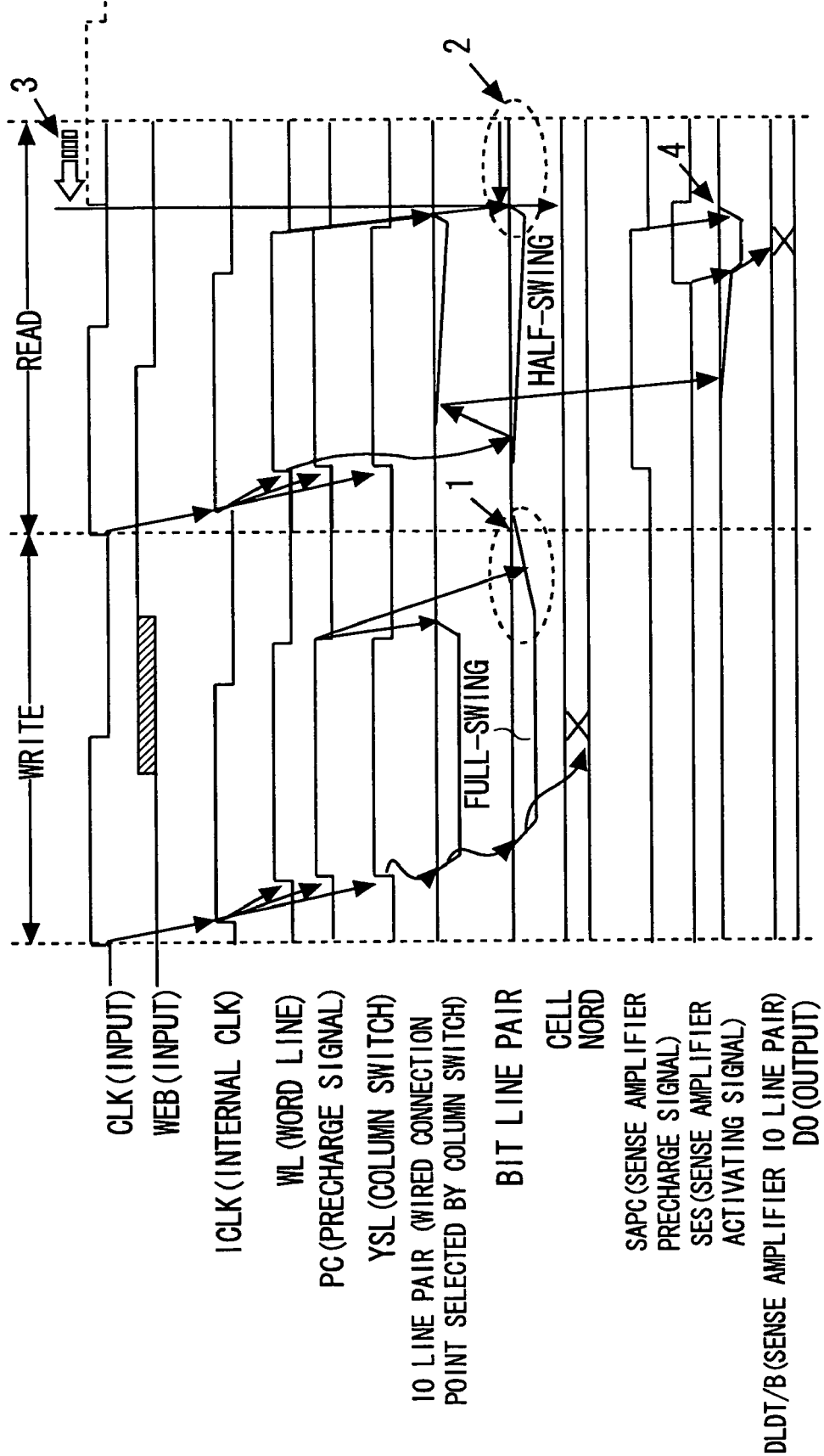

SEMICONDUCTOR MEMORY DEVICE

FIELD OF THE INVENTION

This invention relates to a semiconductor memory device and, more particularly, to a semiconductor memory device including a synchronous RAM.

BACKGROUND OF THE INVENTION

Recently, the progress in the technique for miniaturization of a semiconductor device is outstanding. For example, a memory mounted on an ASIC (application specific IC) product, such as RAM (random access memory) or ROM (read-only memory), is used for a large variety of uses, such as a high-end server, a high-end router or a mobile use and, in keeping up with the tendency to the increase of the capacity of the RAM, there is raised a demand for a higher density (a smaller area) and for a higher operating frequency.

Under this situation, the so-called precharge operation, which directly follows the write operation and which completes the write operation of a memory cell by causing a full-swing of the bit line pair to which the memory cell is connected, is one of the factors limiting the frequency characteristic of the RAM.

The RAM which can meet the request on the part of users cannot be achieved without speedup of the cycle of the write cycle. However, the state-of-the-art RAM suffers from a gap between the characteristics for the write cycle and those for the read cycle. This difference tends to be more apparent with increase in the memory capacity of the RAM.

FIG. 9 shows characteristics of write cycle and read cycle in a RAM, in a tabulated form. This figure shows that the write cycle takes time longer by 6 to 15% than the read cycle, with the difference being 200 ps to 1.1 ns.

FIG. 10 is a timing chart for illustrating the internal operation in a conventional typical synchronous RAM. A word line pulse driving system is used in which, after rising of an external input clock (CLK), an internal reference clock (ICLK) is generated to set a selected word line (WL) to an activated state only for a predetermined period of time. The pulse timing is set from the perspective of assuring a variety of operational margins of the RAM, such as assuring time of inverting a cell (write operation), and cell read margin (read operation).

As long as the write cycle is concerned, the timing is set so that one of the voltages applied to one of the bit lines of a bit line pair is changed from the VDD level to the GND level, with a 'full-swing' operation, as indicated at '1' in FIG. 10 in order that a stabilized voltage level will be obtained despite a variety of sorts of variable elements in cell inversion, while the voltage applied to the other bit line remains at VDD. The Variable elements in cell inversion includes process-related elements or variable elements in the cells or in loads on bit lines.

On the other hand, as for a read cycle, the timing is set so that a 'half-swing' operation, as indicated at '2' in FIG. 10, will be carried out because it is only sufficient to send the difference potential, as needed by an I/O line pair (DLDT/DLDB) of a sense amplifier section used for amplifying the level of the memory cell information once the information has been supplied to the bit lines.

In general, from the perspective of simplifying the peripheral circuit, the write read control clock and the precharge are of the same timing. In FIG. 10, WEB denotes a write enable signal, PC a control signal for controlling the precharging of bit lines, YSL a control signal for on/off control of a column switch, an I/O line pair a wired contact as selected by a column switch YSL, SAPC a precharging signal for the sense amplifier section, SES a sense amplifier enabling signal, DLDT/B an I/O line pair of the sense amplifier section, and DO denotes a data output. The configuration of, for example, the bit line pair, sense amplifier and the I/O line pair of the sense amplifier section is to be in keeping with the routine DRAM configuration as well known in the art. For example, reference may be made to the disclosure of the Patent Documents 2 and 3. The I/O line pair DLDT/B of the sense amplifier section, for example, is equivalent to a line pair IO/IOB connected via a column switch to a bit line pair in the sense amplifier section.

[Patent Document 1]
  JP Patent Kokai Publication No. JP-A-04-326270

[Patent Document 2]
  JP Patent Kokai Publication No. JP-P2000-40370A

[Patent Document 3]
  JP Patent Kokai Publication No. JP-A-10-55673

SUMMARY OF THE DISCLOSURE

In the conventional semiconductor memory device, having the configuration, described above, the operation of precharging the bit line pair following the write operation, that is, following the 'full-swing', as indicated at '1' in FIG. 10, acts as a crucial factor limiting the RAM cycle, owing to the load on the memory cell connected to the bit line pair, or parasitic load elements of the interconnect wires constituting the bit line pair.

Were it not for the speedup of the cycle of the write operation, the realization of the RAM, which will be in keeping with a demand raised by a user, would not be possible, viz., the fact is that, while speedup of the read cycle of the RAM is feasible, as indicated by '3' in FIG. 10, the cycle of the write operation cannot be shortened further, such that cycle speedup is not possible.

Meanwhile, the I/O line pair of the sense amplifier unit (DLDT/B in FIG. 10), connected to the bit line pair via a column switch (YSL of FIG. 10), performs the 'full-swing' operation in a portion indicated by '4' in FIG. 10. However, a parasitic load element in this connecting node is extremely small as compared to the parasitic load on the bit line pair.

Consequently, the write cycle persists to be a factor limiting the RAM cycle.

For coping with the above problem, the conventional technique is taken as an example and described along with its deficiencies.

FIG. 11A schematically shows a state-of-the-art chip, and FIG. 11B schematically shows a chip of Patent Document 1 (JP Patent Kokai Publication No. JP-04-326270A). In FIG. 11A, there are provided a peripheral logic, a clock generator (CLK generator) and a RAM. The peripheral logic supplies a control signal, e.g. a chip select signal CSB, to the RAM. The clock generator supplies a clock signal CLK to the RAM.

In FIG. 11B, there are provided a peripheral logic, a clock generator, a RAM, and a mode decision logic. A chip select signal CSB is supplied from the peripheral logic to the RAM. The mode decision logic receives an R/W flag supplied from the peripheral logic and notifies read/write to the clock generator. The clock generator supplies a read clock RCLK and a write clock WCLK to the RAM at a read operation and at a write operation, respectively.

In distinction from the configuration shown in FIG. 11A, the configuration shown in FIG. 11B generates clocks WCLK and RCLK, capable of separately prescribing the write/read operations, on the chip side. If, in this case, the write/read operations are to be carried out at different frequencies, for example, if the read cycle is to be carried out at half the period of the write cycle, it is necessary to provide a clock generator operating for write at a frequency different from the frequency for read, and a mode decision logic circuit for detecting the write/read operations. That is, an area indicated by NE-1 in FIG. 11B represents an area increase in chip designing.

Moreover, since circuit adjustment presumably needs to be carried out for phase adjustment of a read-clock signal and a write-clock signal, supplied to the RAM, the configuration tends to be non-meritorious for chip designing from the perspective of both chip area and design parameters.

Even if measures for speedup, as well-known in the art, such as providing a circuit for frequency doubling control for read, or introducing sub-array configuration in the inside of the RAM, are used, the result may be an increased chip area of the RAM or the rise in the chip cost.

For a user of the RAM, it is common not to make distinction between READ and WRITE, and the same frequency is used as the frequency of the clock signal, supplied to the RAM, both for WRITE and READ operations. It should be noted that the manner of employing the RAM on the chip represents an important factor influencing the chip performance. For example, in an application where the RAM is used like a ROM, with the RAM being used less frequently for WRITE, with the READ operation accounting for the major portion of the operation of the RAM, it is the READ cycle that determines the chip performance. However, the state-of-the-art RAM is governed by the write cycle, such that cycle compaction is not feasible.

With such RAM, the frequency characteristics of the RAM, determined by the write cycle, cannot be said to be meritorious for the user, and are merely deterrent to improving the chip performance.

As described above, the fact that the frequency characteristics of the conventional semiconductor memory device are stipulated by the write operation is one of factors limiting the chip performance.

The invention disclosed in the present application is of the following general configuration.

According to the present invention, there is provided a circuit for canceling the post-write internal operation, and the operating frequency may be prescribed by a read cycle.

Preferably, according to the present invention, the read operation is carried out in one clock cycle and whether the write operation is to be carried out in plural clock cycles or in one clock cycle is adapted to be selectable.

Preferably, according to the present invention, whether the write operation is to be carried out in plural clock cycles or in one clock cycle may be selectable from an external terminal.

Preferably, according to the present invention, metal fuses are blown off or not blown off based on pass/fail results of a wafer test of a semiconductor memory device. It may be selected whether memory cell write is to be carried out in plural clock cycles or in one clock cycle.

According to the present invention, an internal clock generating circuit which is supplied with an external clock signal sent from outside the semiconductor memory device to generate an internal clock signal to be supplied to a random access memory includes a circuit for canceling internal clock generation, configured for generating a signal activating the internal clock signal, based on an external clock signal, a chip select signal and a write enable signal, and a circuit for setting the internal clock signal, based on an output of the circuit for canceling internal clock generation, and for resetting the internal clock signal based on an internal clock reset signal entered. The circuit for canceling internal clock generation does not generate a signal activating the internal clock signal during a cycle next following the write operation, with the cycle provided in rear of a write operation being a dummy cycle.

According to the present invention, an internal clock generating circuit which is supplied with an external clock signal, supplied from outside the semiconductor memory device, to the semiconductor memory device, to generate an internal clock signal to be supplied to a random access memory, includes a circuit for canceling internal clock generation, which circuit for canceling internal clock generation includes a counter for counting the external clock signal, a circuit for detecting the activation of the write enable signal and for generating a signal for resetting the counter, a decision circuit receiving an output signal of the counter and with an internal clock reset signal entered, and having an output deactivated by deactivation of the internal clock signal and activated at a time point when the counter has counted a predetermined number of counts of the external clock signal, and a logic circuit generating a signal activating the internal clock signal, during a write operation, based on the external clock signal, chip select signal, a write enable signal and an output of the decision circuit, and a circuit for setting an internal clock signal based on an output of the circuit for canceling internal clock generation, and for resetting the internal clock signal based on the internal clock reset signal. The circuit for canceling internal clock generation sets a cycle next following a write operation as being a dummy cycle, without generating a signal activating the internal clock signal during the cycle next following the write operation.

In the dummy cycle, the write enable signal is not activated, while the chip select signal is activated and no internal clock signal is generated.

According to the present invention, an internal clock generating circuit, receiving an external clock signal supplied from outside the semiconductor memory device, a chip select signal which, when activated, is set to a first logic level, and a write enable signal which is set to said first logic level at the write time, to generate an internal clock signal to be supplied to a random access memory, comprises: an inverter, receiving said chip select signal, for outputting an inverted signal of said chip select signal; a latch circuit, receiving said write enable signal from a data terminal, for sampling said write enable signal responsive to said external clock signal and outputting an inverted signal of a sampled value; a first logic circuit, receiving said external clock signal, an output signal of said inverter and an output signal of said latch circuit, for outputting a signal in an activated state, when said external clock signal, the output signal of said inverter and the output signal of said latch circuit being are of the second logic level; a first signal generating circuit, receiving the output signal of said first logic circuit and said external clock signal, said first signal generating circuit activating a first set signal based on said external clock signal, when said output signal of said first logic circuit is in an activated state, and outputting the activated first set signal; and a set/reset circuit for setting an internal clock signal based on transition of said first set signal to an activated state and for resetting said internal clock signal based on an internal clock reset signal entered. In a cycle next following a write cycle, said write enable signal is set to a second logic level, a signal activating said internal clock signal is not activated and said cycle following said write operation is made a dummy cycle.

According to the present invention, the internal clock generating circuit includes: a second logic circuit, receiving said external clock signal, an output signal of said inverter and an output signal of said latch circuit, for outputting a signal in an activated state, when said external clock signal and the output signal of the inverter are both at a second logic level and the output signal of said latch circuit is at a first logic level; a second signal generating circuit, receiving an output signal of said second logic circuit and said external clock signal, for activating a second set signal and outputting the activated signal, when the output signal of said second logic circuit is in an activated state, based on said external clock signal; a gate control circuit for performing control to suppress transmission of said second set signal output from said second signal generating circuit, during a clock cycle next following a write cycle, based on an output signal of said latch circuit and on said external clock signal, said gate control circuit outputting, if otherwise, a second set signal output from said second signal generating circuit; and a third logic circuit, receiving an output signal of said first signal generating circuit and an output signal of said gate control circuit, said third logic circuit activating a signal for activating said internal clock signal when one of said output signals is activated to supply the activated signal to said set/reset circuit.

The meritorious effects of the present invention are summarized as follows.

According to the present invention, it is possible to provide a RAM in which the chip performance may be improved by approximately 10% to 15% or more, without managing complex control, to meet a wide gamut of user requests.

According to the present invention, it is unnecessary to provide logic control or logic circuitry which may render chip designing complicated.

According to the present invention, the chip performance may be improved as the increase in the chip area for the RAM is suppressed to a minimum value.

Moreover, according to the present invention, terminal design parameters of a conventional RAM may be applied unchanged.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIG. 9 shows the results of comparison, in a tabulated form, the characteristics of the write cycle and those of the read cycle in a 130 nm generation RAM.

FIG. 10 is a timing chart illustrating the operation of a conventional RAM.

PREFERRED EMBODIMENTS OF THE INVENTION

Figure 1:
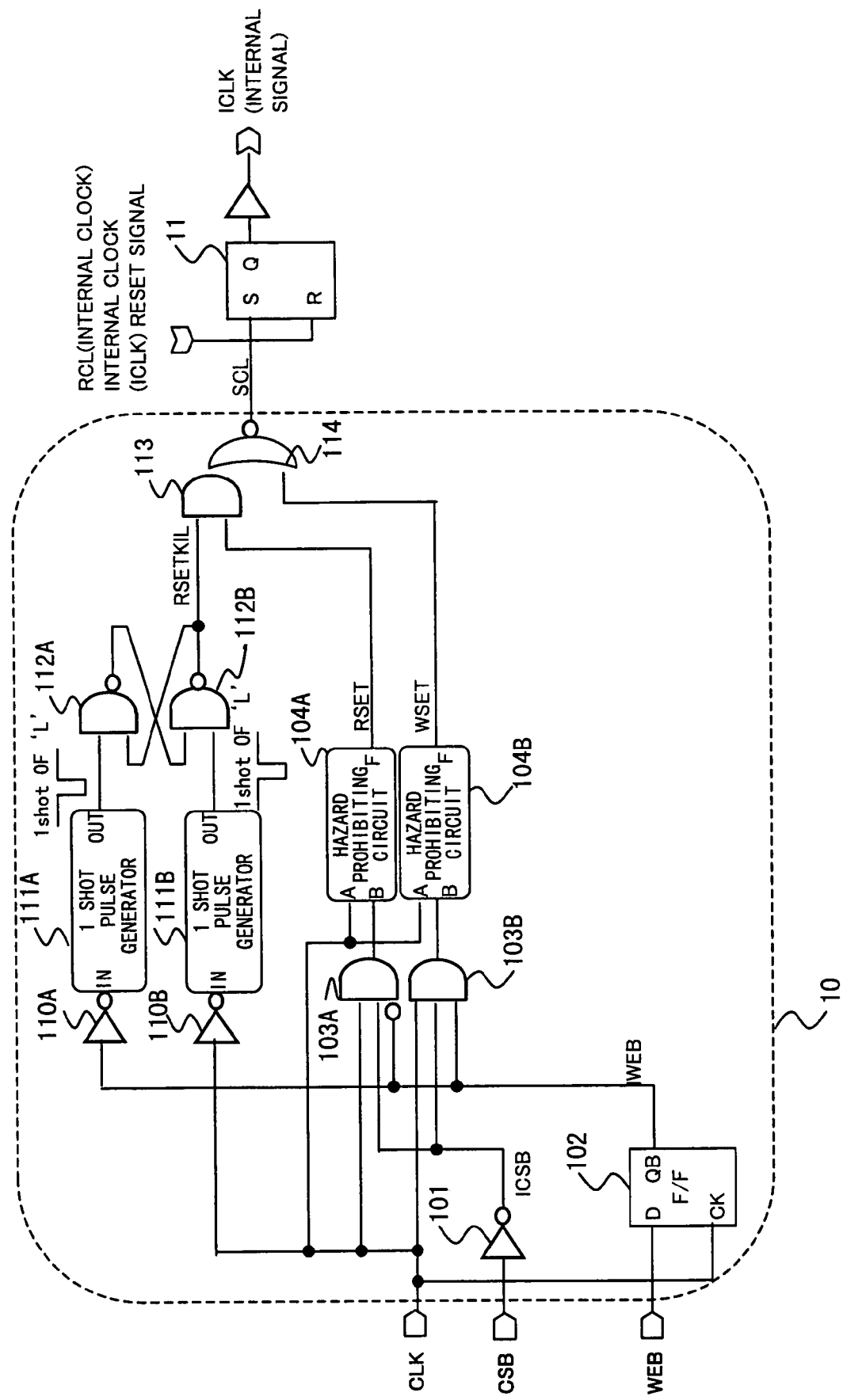
FIG. 1 is a diagram illustrating the configuration of an internal clock generating circuit of an embodiment of the present invention.
Figure 11A:
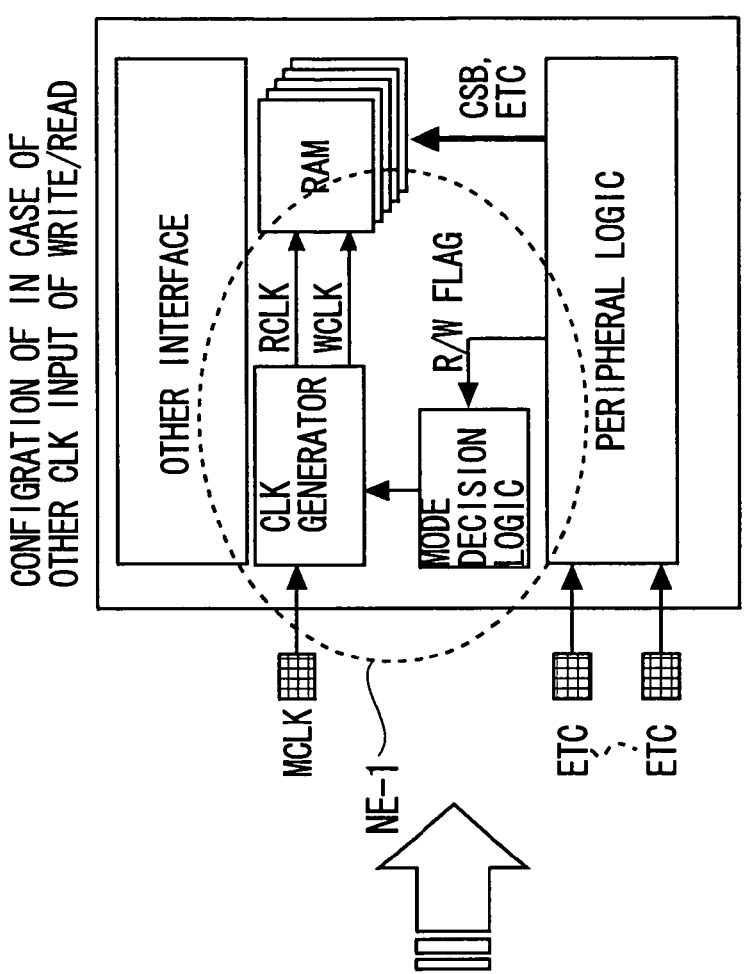
FIG. 11A is a diagram illustrating the configuration of a state-of-the-art chip and FIG. 11B shows write/read with separate clocks.
Figure 11B:
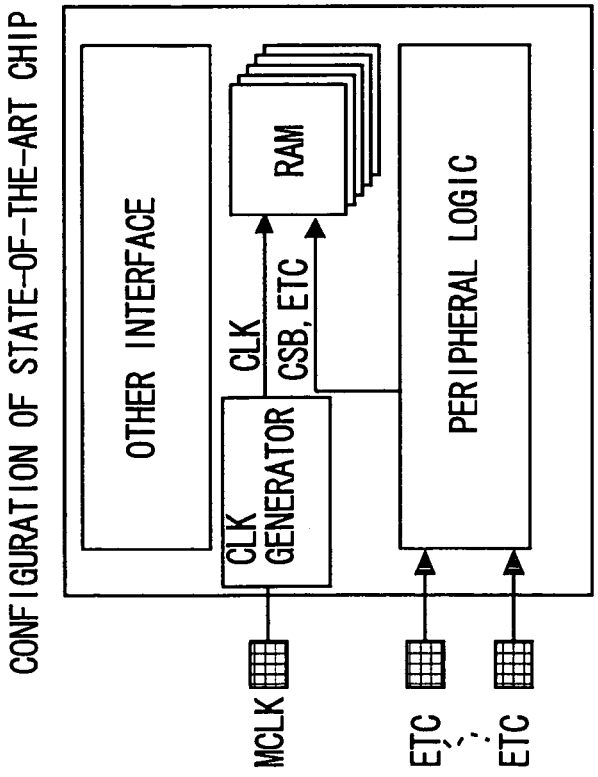

Referring to the drawings, certain preferred embodiments of the present invention will be described in detail. FIG. 1 is a diagram illustrating the configuration of essential portions of a semiconductor memory device according to an embodiment of the present invention. In the present embodiment, the method for controlling the read operation of the RAM itself is the same as a conventional control method described with reference to e.g. FIG. 11A. The present embodiment is provided with a circuit for canceling internal clock generation 10 (see FIG. 1) within the RAM for canceling the internal operation of the RAM of a cycle next following the write operation, and the manner for controlling write operation according to the present embodiment differs from the conventional controlling manner.

More specifically, the circuit for canceling internal clock generation 10 of the present embodiment, shown in FIG. 1, includes, only by way of illustration, a CLK terminal, as a terminal for receiving a clock signal from outside the RAM, a terminal CSB (chip select (low active)), for receiving a signal controlling the internal operation of the RAM from outside, and a terminal WEB (write enable (low active)) for receiving a signal for controlling the write/read operation of the RAM from outside. The circuit for canceling internal clock generation 10 further includes an inverter 101, an edge-triggered D-type flip-flop 102, three-input AND circuits 103A and 103B, hazard prohibiting circuits 104A and 104A, inverters 110A and 110B, one-shot pulse generators 111A and 111B, NAND circuits 112A and 112B, an AND circuit 113, and a two-input NOR circuit 114. The inverter 101 outputs a signal ICSB, which is obtained by inverting the CSB. The D-type flip-flop 102 latches the WEB using the rising edge of the clock signal CLK and outputs an inverted signal of the latched signal as IWEB from an inverting output terminal QB. The three-input AND circuit 103A receives the signals ICSB, CLK and IWEB (inverted), takes the logical product of the three signals, outputs a high level when ICSB and CLK are high and IWEB is low, and outputs a low level when otherwise. The three-input AND circuit 103B receives the signals ICSB, CLK and IWEB, take the logical product of the three signals. The hazard prohibiting circuit 104A receives CLK and an output signal of the three-input AND circuit 103A and outputs a set signal RSET (one-shot pulse) for READ. The hazard prohibiting circuit 104B receives CLK and an output signal of the three-input AND circuit 103B and outputs a set signal WSET (one-shot pulse) for WRITE. The AND circuit 113 receives RSET output from the hazard prohibiting circuit 104A and a killer signal RSETKIL, as later described. The two-input NOR circuit 114 receives an output of the AND circuit 113 and an output of the hazard prohibiting circuit 104B. An output of the two-input NOR circuit 114 is a signal SCL.

The aforementioned RSETKIL is a killer signal used for managing control so that a set signal RSET for READ, activated during a dummy cycle following the write cycle, will not be transferred as SCL. Although there is no particular limitation to the circuit for generating the RSETKIL, the circuit used in the present embodiment is configured as shown in FIG. 1. That is, the circuit for generating the RSETKIL includes inverters 110A and 110B, one-shot pulse generators 111A and 111B, and two-input NAND circuits 112A and 112B. The inverter 110A receives IWEB from the D-type flip-flop 102. The one-shot pulse generator 111A is supplied at its input terminal IN with an output signal of the inverter 110A and generates a low level one-shot pulse in synchronization with the rising edge of an output signal of the inverter 111A. The inverter 110B receives a clock signal CLK. The one-shot pulse generator 111B is supplied at its input terminal IN with an output signal of the inverter 110B and generates a low level one-shot pulse in synchronization with the rising edge of an output signal of the inverter 110B. The two-input NAND circuits 112A and 112B are supplied respectively with outputs of one-shot pulse generators 111A and 111B and have outputs cross-coupled to the other inputs to compose an SR latch.

When the outputs of the one-shot pulse generators 111A and 111B are both at a high level, an output RSETKIL of the two-input NAND circuit 112B is at a high level. Since the two inputs of the two-input NAND circuit 112A are both at a high level, the output of the NAND circuit 112A is low. The two-input NAND circuit 112B is fixed at a high level. If, in this state, the clock CLK rises, and IWEB undergoes transition from a high level to a low level, the RSETKIL is set to a low level in synchronization with the falling edge of a low level one-shot pulse output from the one-shot pulse generator 111A. That is, responsive to a low level of the output of the one-shot pulse generator 111A, the output of the two-input NAND circuit 112A becomes high, while the two inputs of the two-input NAND circuit 112B are both high, so that its output RSETKIL becomes low. If, with the RSETKIL in a low level, the CLK falls from a high level to a low level, the output RSETKIL of the two-input NAND circuit 112B transitions to a high level in synchronization with the falling edge of a low level one-shot pulse output from the one-shot pulse generator 111B. Meanwhile, after generation of the low-level one-shot pulse from the one-shot pulse generator 111B, RSETKIL is maintained at a high level.

Figure 12:
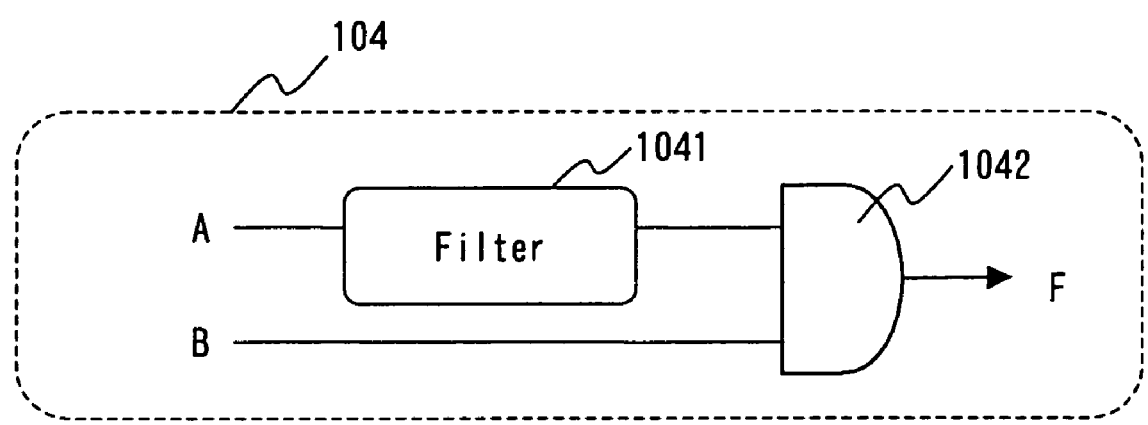
FIG. 12 is a diagram illustrating the configuration of a hazard prohibiting circuit of FIG. 1.

FIG. 12 is a diagram illustrating the configuration of the hazard prohibiting circuits 104A and 104B shown in FIG. 1. The hazard prohibiting circuits 104A and 104B are of the same configuration and each include a filter 1041 for delaying the clock signal CLK as entered at a terminal A, and a two-input AND circuit 1042, configured for outputting the result of taking AND operation between an output signal of the filter 1041 and a signal supplied to a terminal B. The filter 1041 is made up by a CR circuit, or a plural number (an even number) of stages of inverters, and has a delay long enough to absorb the short pulse output from the previous stage three-input AND circuits (103A and 103B) and which is supplied to the terminal B. That is, if the signal supplied to the terminal B is high at the time point of the rising edge of the clock signal CLK supplied to the terminal A but becomes low within a time interval not so long as the delay time of the filter 1041 (such as a-glitch like pulse), there is issued no high level pulse from the output of the two-input AND circuit 1042, which output remains at the low level to evade the hazard. If, when the output from the filter 1041 (delayed clock signal) is at a high level, an input signal to the terminal B is maintained at a high level, a high level is output from the two-input AND circuit 1042. If, in this state, the input signal to the terminal B is changed from the high level to the low level, with the rising edge of the clock signal CLK, for example, the output of the two-input AND circuit 1042 becomes low.

The output signal SCL of the internal clock generating canceling circuit 10 is supplied to a set terminal S of an SR flip-flop (SR latch) 11. An output of the SR flip-flop 11 is output as an internal clock signal ICLK which is supplied for example to the RAM. An internal clock reset signal RCL is supplied to a reset terminal R of the SR flip-flop 11.

Figure 13:
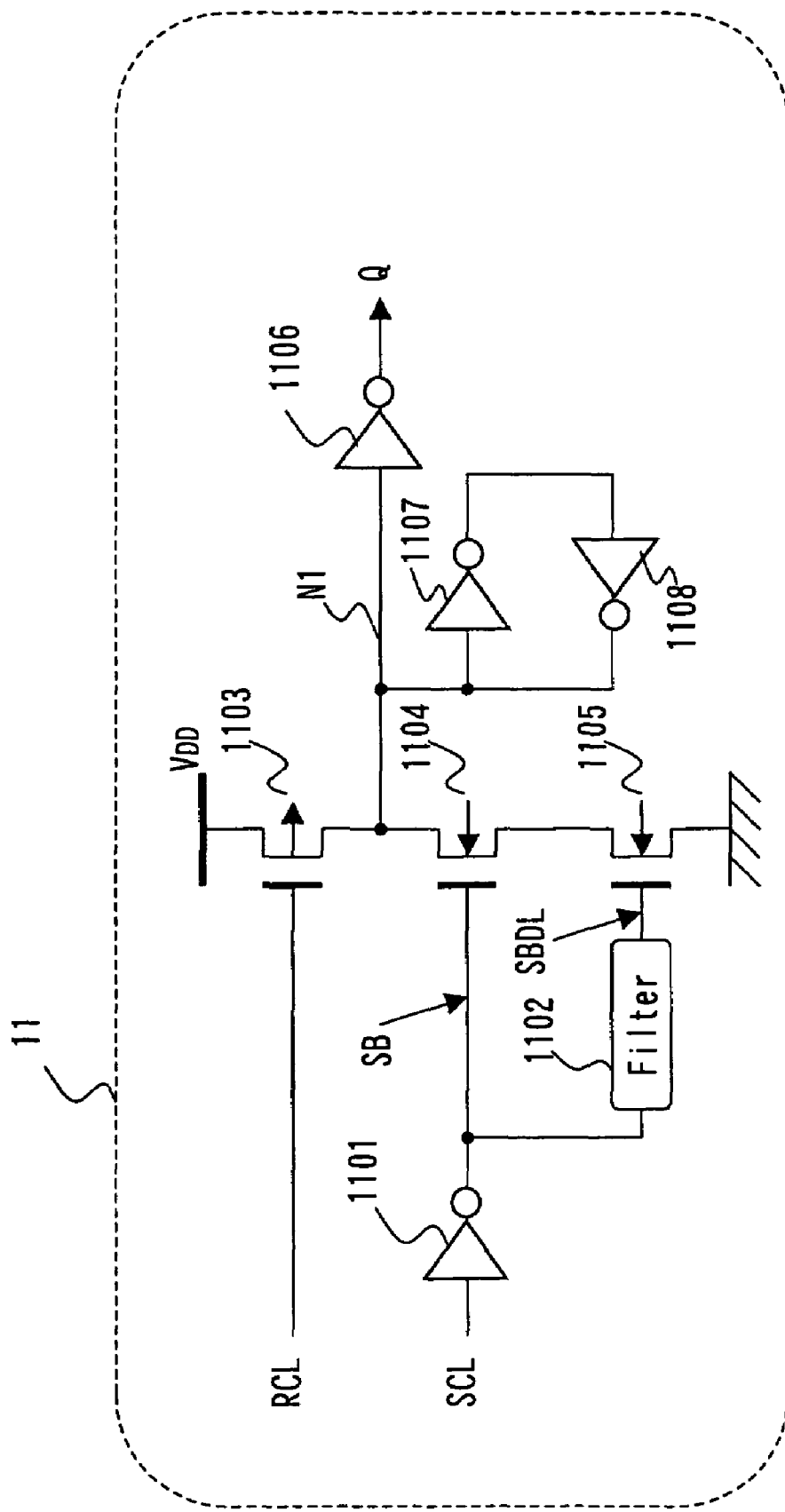
FIG. 13 is a diagram illustrating the configuration of a SR flip-flop of FIG. 1.

FIG. 13 is a diagram illustrating the configuration of the SR flip-flop 11. Referring to FIG. 13, the SR flip-flop 11 includes an inverter 1101 for inverting the SCL, a filter 1102 for delaying an output SB of the inverter 1101, a PMOS transistor 1103 which has a source connected to a power supply and has a gate supplied with the RCL, an NMOS transistor 1104 which has a drain connected to a drain of the PMOS transistor 1103 and has a gate connected to an output of the inverter 1101, an NMOS transistor 1105 which has a drain connected to the source of the NMOS transistor 1104, has a gate connected to an output SBDL of the filter 1102 and has a source grounded, an inverter 1106 which has an input connected to a connection node N1 of the drains of the PMOS transistor 1103 and the NMOS transistor 1104 and has an output connected to a terminal Q to output ICLK, an inverter 1107 which has an input connected to the connection node N1 of the drains of the PMOS transistor 1103 and the NMOS transistor 1104, and an inverter 1108 which has an input connected to an output of the inverter 1107 and has an output connected to the input of the inverter 1107.

Figure 14:
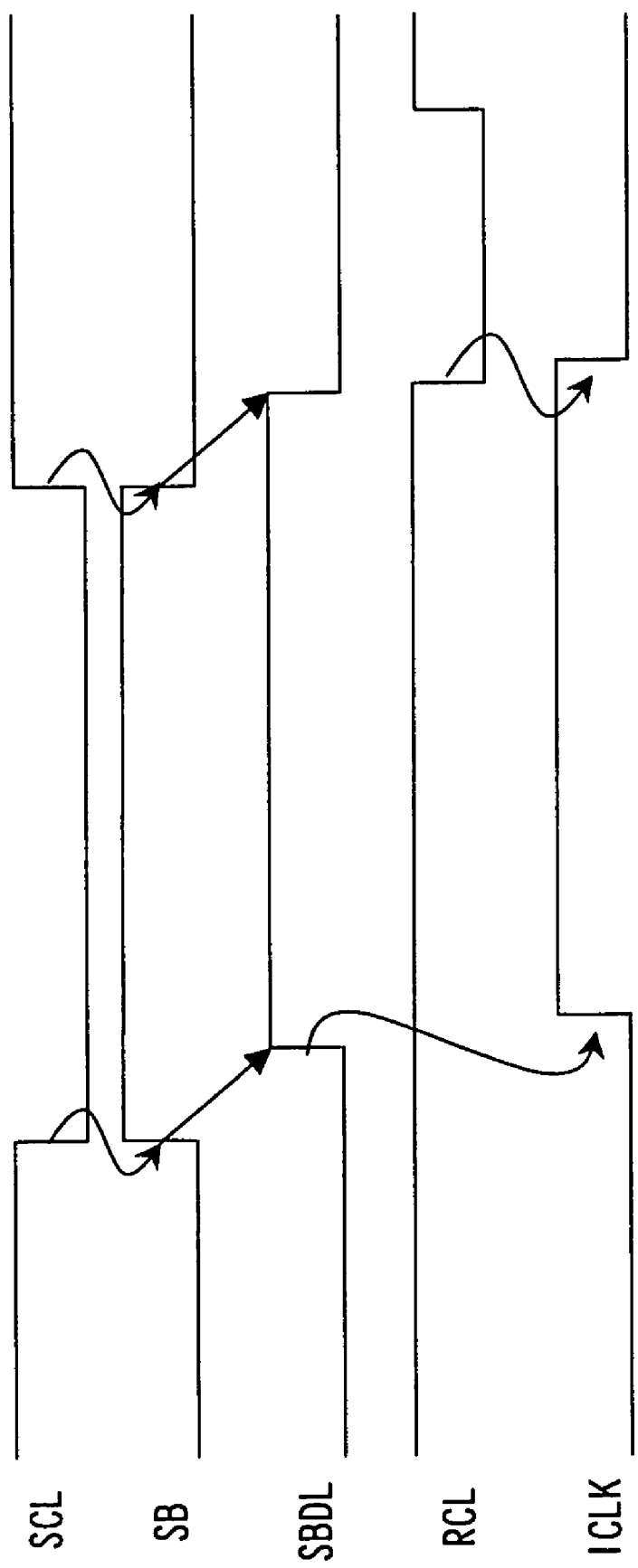
FIG. 14 is a timing chart illustrating a typical operation of the SR flip-flop of FIG. 13.

FIG. 14 shows a typical timing waveform for illustrating the operation of the SR flip-flop of FIG. 13. On transition of the SCL from a high level to a low level, the output SB of the inverter 1101 changes from a low level to a high level and, after lapse of a delay time of the filter 1102, the output SBDL changes from a low level to a high level. When both the SB and the SBDL are at a high level, both the NMOS transistors 1104 and 1105 are turned on, and the input node of the inverter 1106 goes low, as a result of which the inverter 1106 outputs a high level.

When the RCL is at a high level, the PMOS transistor 1103 is turned on, the input node of the inverter 1106 goes high and the inverter 1106 outputs a low level. The flip-flop, composed by the inverters 1107 and 1108, operates for holding the value of the node N1, such that, when the PMOS transistor 1103 is turned off, at least one of the NMOS transistors 1104 and 1105 is turned off, and the paths between the node N1 and the power supply VDD and between the node N1 and GND are both off, the level of the node N1 is set at a directly previous level (high level or low level).

Figure 2:
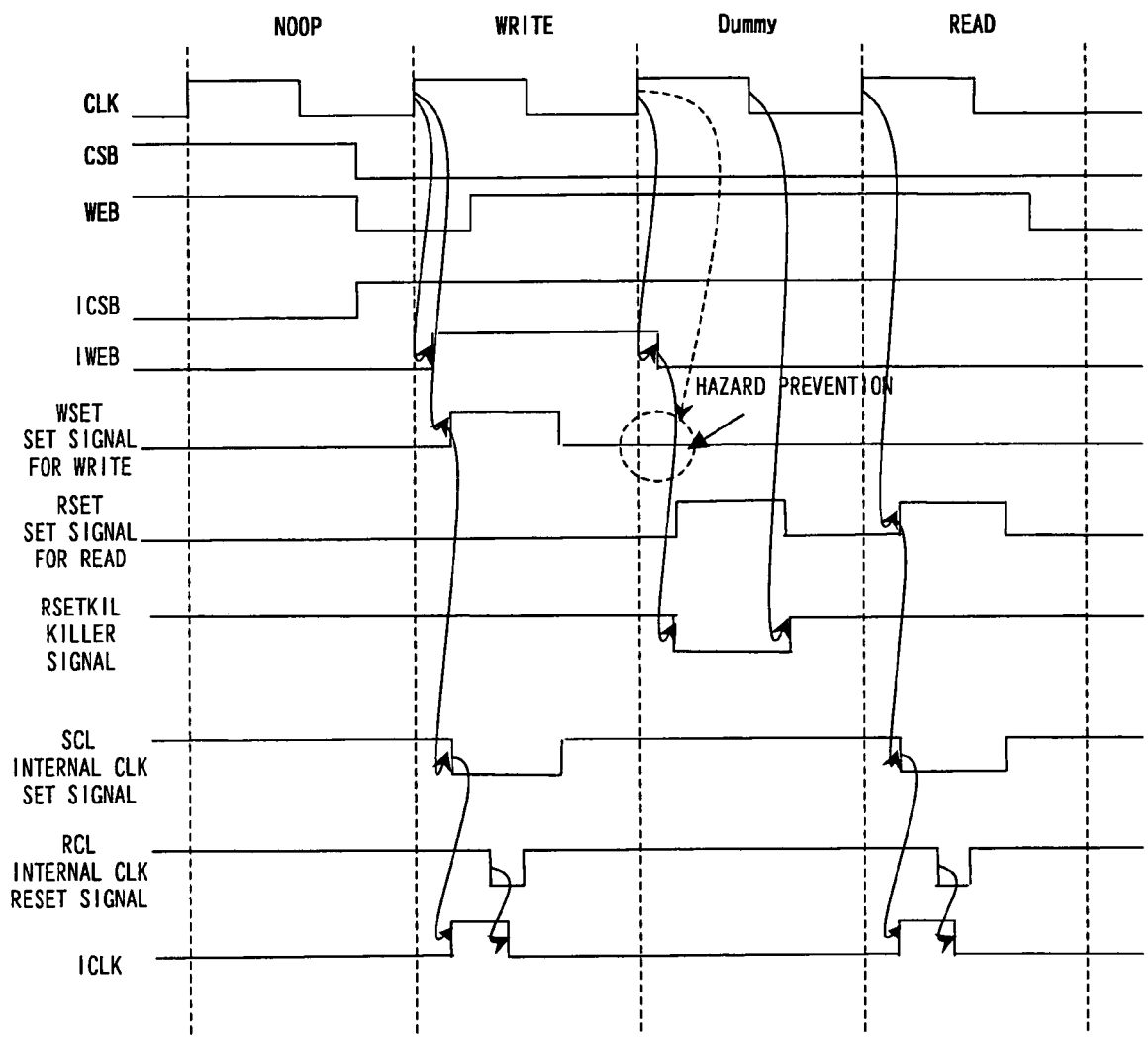
FIG. 2 is a timing chart illustrating the operation of the internal clock generating circuit of the embodiment of the present invention.

FIG. 2 is diagram illustrating a timing chart in an internal clock generator (CLK generator) according to an embodiment of the present invention. A read operation of one clock and a write operation, followed by a dummy cycle, are provided, with the write operation being of a length of two clocks or longer. Thus, the apparent RAM operating frequency is increased, without increasing an area, such as an area of a peripheral circuit, such as to improve the chip performance.

During the non-access time (see the clock cycle NOOP of FIG. 2), a chip select signal CSB is at a high level (ICSB at a low level), the outputs RSET and WSET of the hazard prohibiting circuits 104A and 104B are both at a low level, and the SCL is at a high level. The killer signal RSETKIL is at a high level.

During the access operation, the chip select signal CSB is at a low level (ICSB is at a high level) and, during the write access (see the WRITE clock cycle of FIG. 2), the D-type flip-flop 102 samples the low level WEB with the rising edge of the clock signal CLK, so that its inverted output IWEB then becomes high. When the ICSB and CLK are at a high level, the output of the three-input AND circuit 103B changes from a low level to a high level, responsive to the transition of the IWEB from a low level to a high level, so that a high level pulse is output as the output WSET from the hazard prohibiting circuit 104B. The start position of the high level pulse of the WSET corresponds to the pulse start position of the clock CLK delayed by the filter 1041 (see FIG. 12) in the hazard prohibiting circuit 104B, while the pulse end position of the WSET corresponds to the falling edge of the clock CLK. Since RSET is at a low level, and an output of the AND circuit 113 is at a low level, during this cycle, a low level pulse is output as SCL internal CLKSET signal, in synchronization with a high level pulse of the WSET. The output ICLK of the SR flip-flop 11, responsive to the low level pulse of the SCL, undergoes transition from a low level to a high level. The RCL internal CLKRESET signal then becomes low with the output ICLK of the SR flip-flop 11 then changing from a high level to a low level.

The output of the three-input AND circuit 103B goes low with the falling edge of the clock signal CLK during the write cycle, and the output WSET of the hazard prohibiting circuit 104B becomes low.

During the next dummy cycle (see the Dummy clock cycle of FIG. 2), the output IWEB of the D-type flip-flop 102 becomes low in synchronization with the rising edge of the clock signal CLK. The output of the three-input AND circuit 103B is at a low level, with the WSET being at a low level. During the dummy cycle, the IWEB is low, CLK is high and ICSB is high, so that the output of the three-input AND circuit 103A is high, and a pulse at a high level is output as output RSET from the hazard prohibiting circuit 104A. The start position of the high level pulse of RSET corresponds to the start position of the pulse CLK delayed by the filter 1041 in the hazard prohibiting circuit 104A (see FIG. 12). The end position of the pulse RSET corresponds to the falling edge of CLK. However, since the killer signal RSETKIL is low, the output of the AND circuit 113 is low, and the output SCL of the two-input NOR circuit 114 remains at a high level. Hence, the internal clock signal ICLK remains at a low level. That is, during the dummy cycle, the generation of the internal clock signal ICLK is canceled. Meanwhile, the portion indicated 'hazard prohibition' of the WSET in the dummy cycle of FIG. 2, corresponding to transition of IWEB from a high level to a low level at the cycle start time, indicates that, at a dummy cycle start timing, an output of the three-input AND circuit 103B is at a high level until the time point of the falling edge of the IWEB, however, the output of the three-input AND circuit 103B becomes low within a time period not so long as the delay time of the filter 1041 in the hazard prohibiting circuit 104B, and hence no high level pulse is output as the WSET, thus enabling hazard prevention. Meanwhile, during the dummy cycle, the killer signal RSETKIL is set to a low level, in synchronization with the falling edge of the IWEB, while being reset to a high level in synchronization with the falling edge of the CLK.

During the next read cycle (the clock cycle of READ of FIG. 2), the output of the three-input AND circuit 103A becomes high, so that a high level pulse signal is output as an output RSET of the hazard prohibiting circuit 104A. Since the killer signal RSETKIL is at a high level at this time, the output of the AND circuit 113 becomes high, so that the two-input NOR circuit 114 outputs a low level one-shot pulse of the SCL internal CLKSET signal. Responsive thereto, the SR flip-flop 11 outputs an internal clock ICLK.

Figure 3:
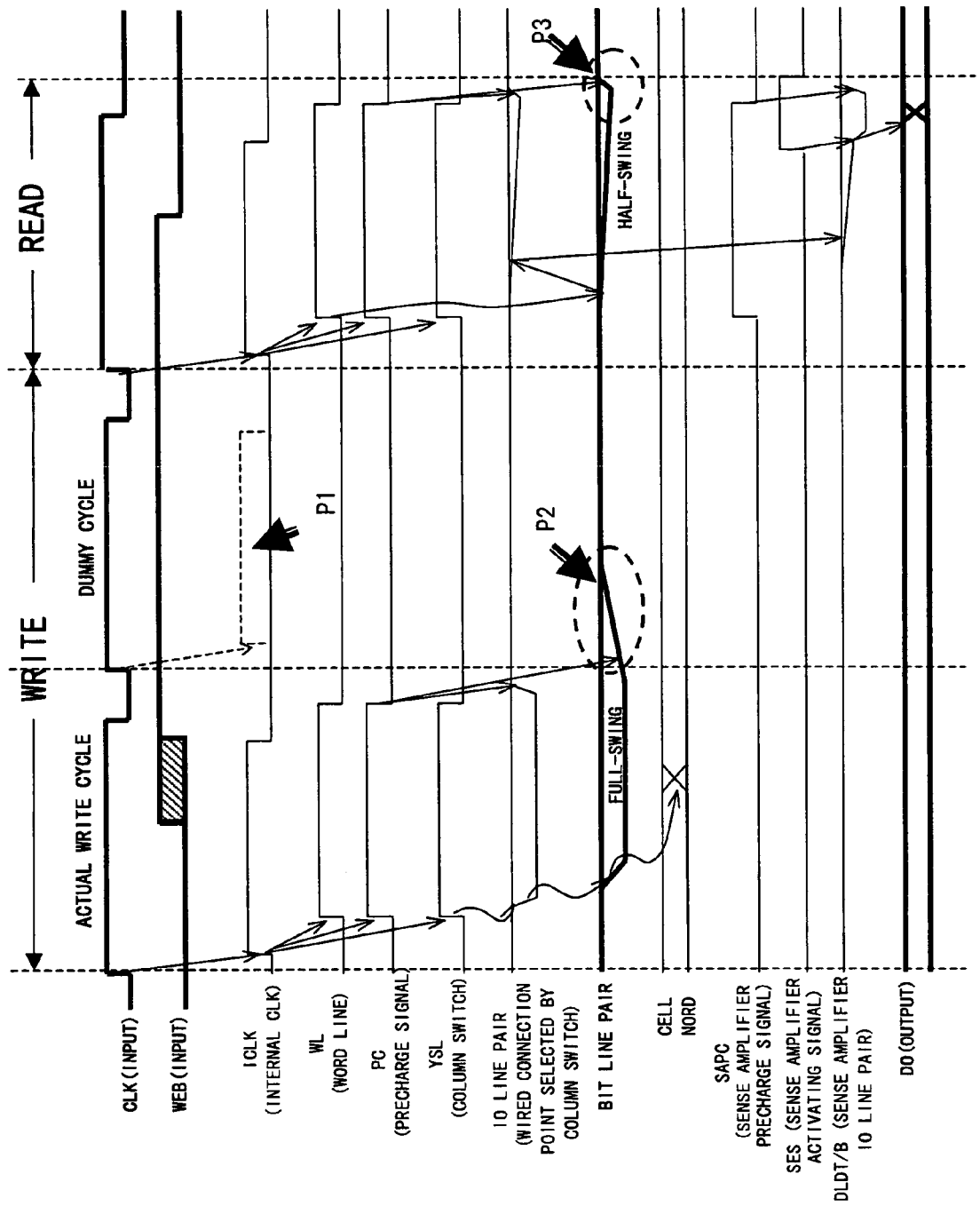
FIG. 3 is a timing chart for illustrating the operation of a RAM of the embodiment of the present invention.

FIG. 3 is diagram illustrating a timing chart of a RAM of a first embodiment of the present invention. The operation and the favorable effect of the present invention may readily be understood by comparing the timing chart of FIG. 10 with that of FIG. 3. In this figure, the names of the signal terminals of FIG. 3 correspond to those of FIG. 10.

As indicated by 'P1' of FIG. 3, the internal clock signal ICLK, next following the write operation, is not generated, owing to the circuit for canceling internal clock generation 10. Thus, during the write operation, the desired operation is completed by employing a period corresponding to two clock cycles, whereby there is no risk that the operating frequency of the RAM is limited by the pre-charge operation following the full-swing operation on the bit line pair, a behavior occurring at the end time point of the write operation, as indicated at P2 in FIG. 3. The precharge operation 'P2' following the full-swing operation on the bit line pair takes place during the dummy cycle.

Thus, it becomes possible to determine the length of the operating cycle (operating frequency) by the read operation determining the RAM cycle, more specifically, by the pre-charge operation from the half-swing operation on the bit line pair, as indicated by 'P3' in FIG. 3. This configuration speeds up the apparent operating frequency of the RAM.

In the present embodiment, the conventional RAM terminal design parameters are used unchanged (signal terminals are the same in FIGS. 3 and 10). By completing the write operation of the RAM using the two-clock-cycle period, it is possible to avoid the write operation limiting the clock frequency, thereby improving the chip performance.

Moreover, with the present embodiment, the control for the two-clock write operation may be managed within the RAM to render it possible to improve the chip performance without adding redundant control circuits in the chip designing.

Figure 4:
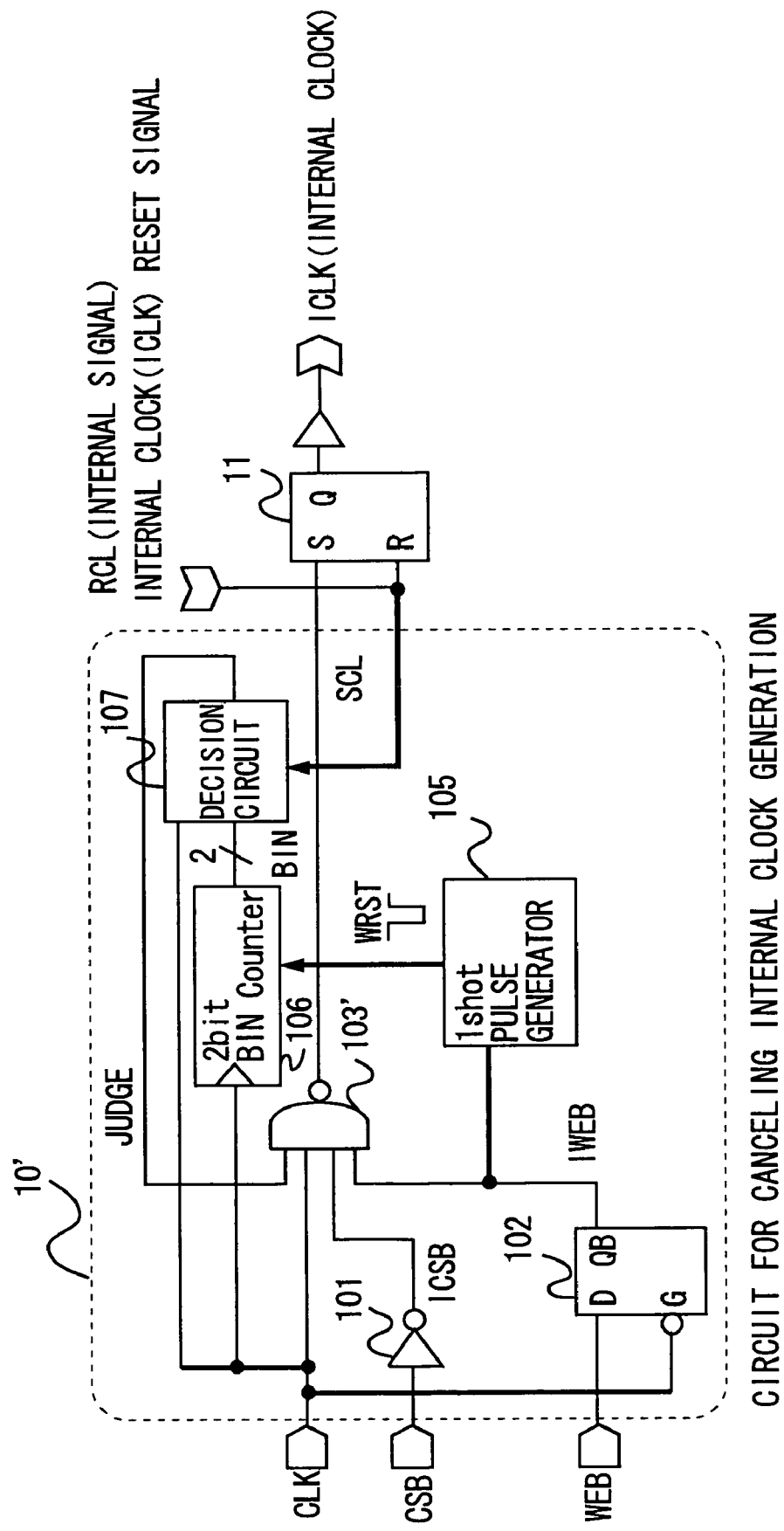
FIG. 4 is a diagram illustrating the configuration of an internal clock generating circuit of a second embodiment of the present invention.
Figure 5:
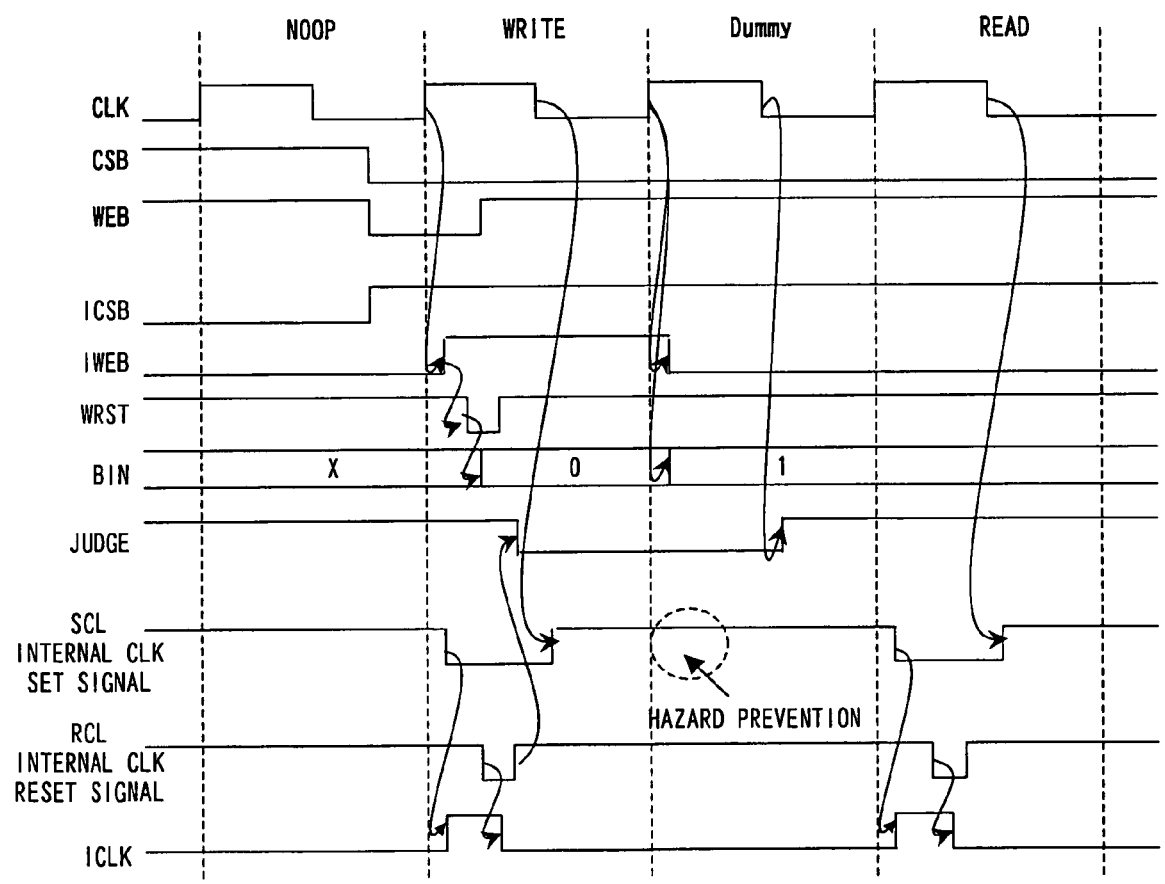
FIG. 5 is a timing chart illustrating the operation of the internal clock generating circuit of the second embodiment of the present invention.

FIG. 4 is a diagram illustrating the configuration of a second embodiment of the present invention. In the second embodiment of the present invention, a binary counter is used to cancel an internal clock next following the write operation (second clock). Meanwhile, in FIG. 4, the configuration of disregarding the second pulse with the aid of a binary counter is used. Specifically, two or more internal clocks of the write operations are canceled using the binary counter. FIG. 5 is a diagram illustrating a timing chart of the second embodiment of the present invention.

Referring to FIGS. 4 and 5, a one-shot pulse generator 105 in a circuit for canceling internal clock generation 10' detects the transition of IWEB from a low level to a high level (the time of WEB activation) and outputs a one-shot pulse WRST (low active) to reset a 2-bit binary counter 106. An output BIN of the 2-bit binary counter 106 is now '0'. At this time, an output JUDGE of a decision circuit 107 is high whilst the SCL internal CLKSET signal, output from a four-input NAND circuit 103', is low, with the ICKL becoming high. The ICLK becomes low with the falling of the RCL internal CLKRESET signal. The output JUDGE of the decision circuit 107 becomes low with the rising of the RCL internal CLKRESET signal. The output of the four-input NAND circuit 103' becomes high and no ICLK is output.

An output BIN of the counter 106 becomes '1' with the rising of the CLK of the dummy cycle and, with the falling of the CLK of the dummy cycle, the output JUDGE of the decision circuit 107 becomes high.

In the present embodiment, the read operation is the same as the operation of the conventional circuit. That is, the ICLK becomes high with the falling of the SCL internal CLKSET, while becoming low with the falling of the RCL internal CLKRESET. With the falling of the CLK, the SCL internal CLKSET becomes high with the falling of the clock CLK.

Thus, the configuration of the present embodiment differs from the previous embodiment described above with reference to FIGS. 1 to 3 as to the configuration of the circuit for internal clock generation cancellation 10'. The operation of the present embodiment is however similar to that of the previous embodiment and hence the explanation is dispensed with.

A further embodiment of the present invention will now be described. Although it is possible to cancel the operation within the RAM, following the write operation, mode setting may also be arbitrarily selected by an external terminal of the RAM for flexibly coping with requests of a user of a RAM of conventional design parameters, as shown in FIG. 6.

Figure 6:
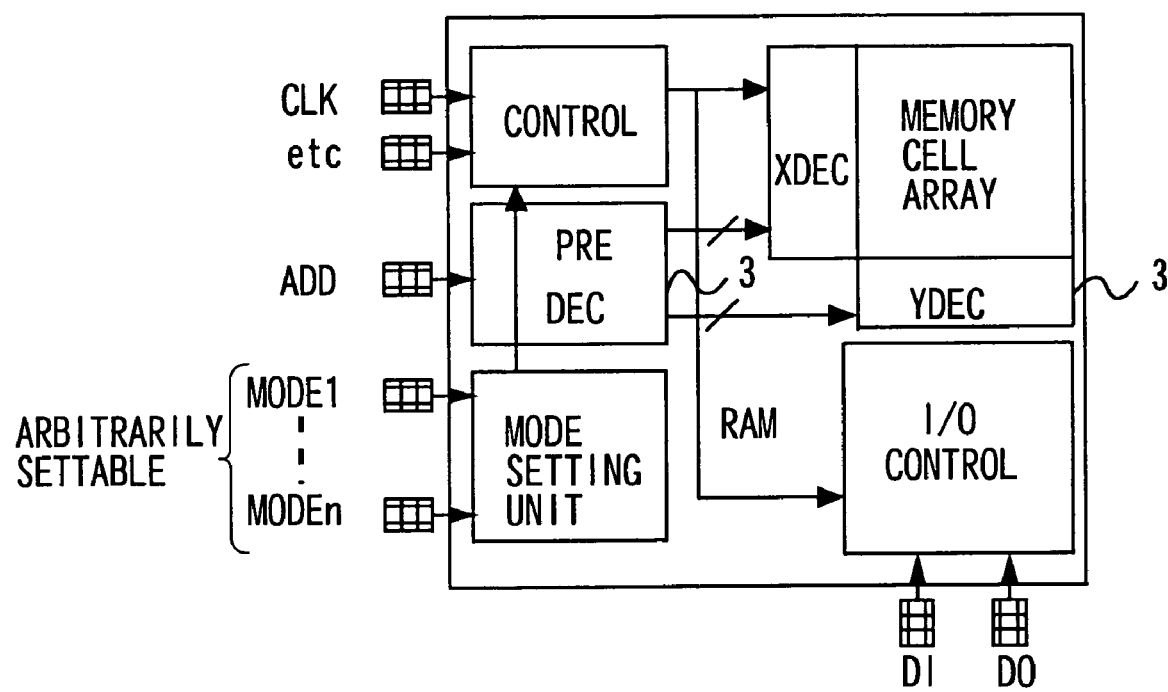
FIG. 6 is a diagram illustrating the configuration of a RAM of a third embodiment of the present invention.

In the embodiment shown in FIG. 6, RAM users may freely select the write frequency (number of clocks) of the RAM using a dedicated terminal provided to the RAM.

Figure 7:
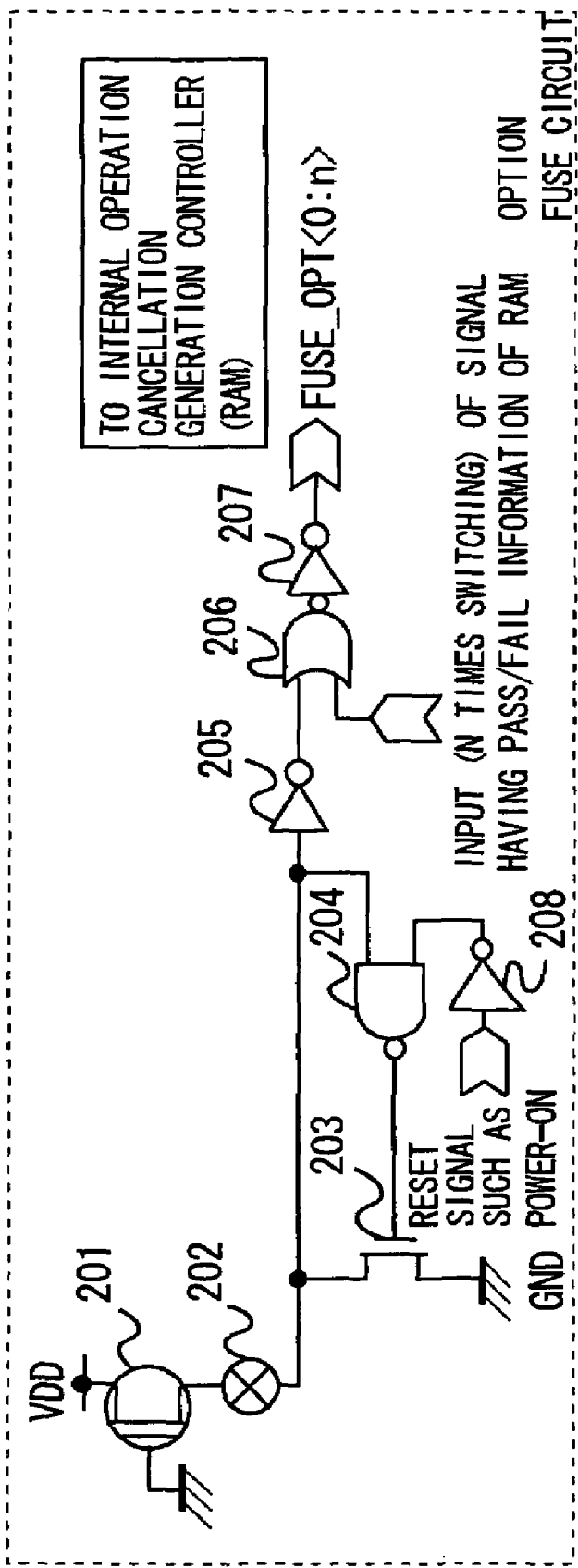
FIG. 7 is a diagram illustrating the configuration of a fourth embodiment of the present invention.

Alternatively, as a modification of the present invention, mode setting for a RAM may be adapted to be controlled, in a product pre-shipment process, using a fuse 202, as shown in FIG. 7, in order to permit flexible accommodation to users. Referring to FIG. 7, when a fuse 202 is not blown off, both inputs of the NAND circuit 204 are high on power on (power supply on) resetting, with an output of the NAND circuit becoming low. An NMOS transistor 203 is turned off, an input of the inverter 205 becomes high, and an output of the inverter 205 becomes low. A NOR circuit 206 outputs an inverted version of a signal carrying the path/fail information of the RAM, and the signal carrying the path/fail information of the RAM is directly output via an inverter 207 as FUSE_OPT <0: n>(n bits from 0). This FUSE_OPT is supplied to an internal operation cancel generation controller, not shown, to control internal clock generation cancellation or non-cancellation. For example, if both write and read pass with one clock operation, the fuse 202 is not blown off, and the write operation is carried out with the same cycle as the read operation. In this case, switching may be made, based on the signal carrying the pass/fail information for the RAM, so that the write operation will be carried out in plural clock cycles. On the other hand, if the fuse 202 has been blown off (fuse blow-off or non-blow-off is selected based on the result of wafer test), the output of the NAND circuit 204 becomes high at the time of power-on resetting, the NMOS transistor 203 is turned on, an input to the inverter 205 becomes low, an output of the NOR circuit 206 is at a low level at all times (FUSE_OPT is at high level at all times) and the signal carrying the path/fail information of the RAM is masked. For example, control is performed so that the internal operation of the cycle next following the write time will unexceptionally be cancelled.

Figure 8:
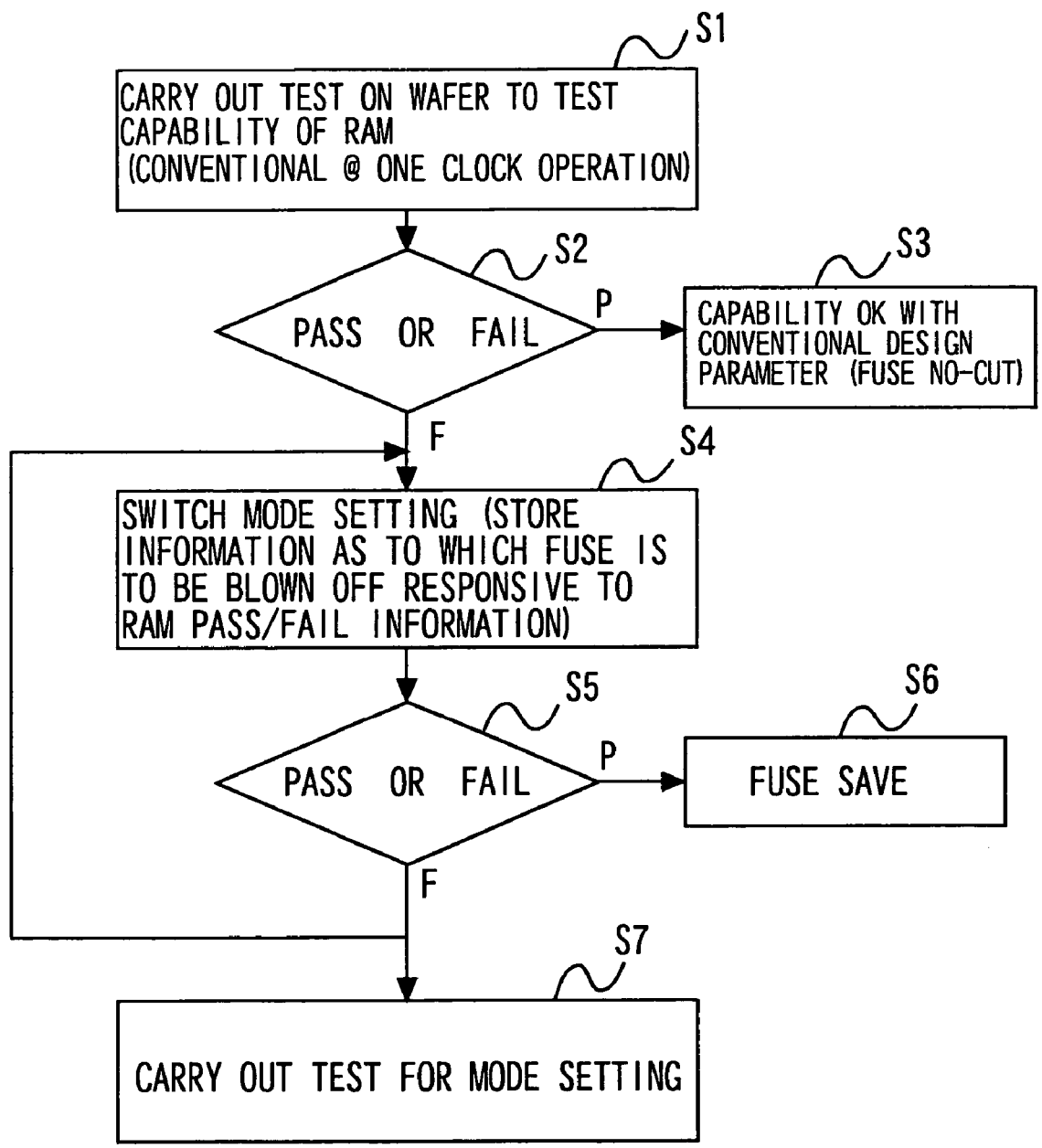
FIG. 8 is a diagram showing a test sequence in a pre-shipment step according to a fourth embodiment of the present invention.

FIG. 8 is a flowchart illustrating the sequence of operations at the time of testing of the RAM provided with the fuse 202 of FIG. 7. In a step S1, the capability of the RAM is tested by a wafer test (one clock operation for each of write and read). When the RAM has passed the test, it is determined to be in keeping with the conventional design parameters (1-clock operation for write). If the RAM has failed in the test in the step S2, the mode setting is changed over in a step S4 and, based on the pass/fail information of the RAM, it is determined which fuse is to be blown off. In case the RAM has passed the test, the fuse information is stored (step S6). In case the RAM has failed in the test, a test for mode setting is carried out (step S7).

In FIG. 8, the write frequency is programmably set in the pre-shipment process, in keeping with the test result for the RAM (pass/fail).

In accordance with the present invention, the chip performance may be improved by approximately 10% to 15% (see FIG. 9; the performance may possibly be improved further depending on the memory capacity of the RAM) without necessitating complex control, such that it becomes possible to provide a RAM capable of meeting a wide range of the user's requests.

In accordance with the present embodiment, neither complex logic control nor complex logic circuit is needed as long as chip designing is concerned.

In accordance with the present embodiment, the chip performance may be improved as the increase in the chip area of the RAM is suppressed to a minimum.

In accordance with the present embodiment, customary design parameters for RAM pins may be applied unchanged. In the present embodiment, a dummy cycle is inserted after the WRITE cycle, and the operating frequency may be set with the frequency of the READ cycle. However, in e.g. a memory controller, desired operations are carried out for the cycle next following the WRITE operation, as the CLK is set high after CSB is set low and WEB is set high.

Although the present invention has so far been described with reference to the above illustrative embodiments, the present invention is not limited to the configuration of the above-described embodiments and may comprise a variety of changes or corrections that may be attempted by those skilled in the art without departing from the scope of the invention.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor memory device comprising:
   a random access memory; and
   an internal clock generating circuit, receiving an external clock signal, for generating an internal clock signal;

said internal clock generating circuit comprising a circuit, receiving a write enable signal, for performing control not to generate the internal clock signal, during a clock cycle next following a cycle in which said write enable signal is activated and a write operation is carried out, based on said write enable signal as deactivated, the cycle next following the write operation being made a dummy cycle.

2. A semiconductor memory device comprising:
a random access memory; and
an internal clock generating circuit, receiving an external clock signal supplied from outside the semiconductor memory device, a chip select signal which, when activated, is set to a first logic level, and a write enable signal which is set to said first logic level for a write access, to generate an internal clock signal to be supplied to said random access memory;
said internal clock generating circuit comprising:
an inverter, receiving said chip select signal, for outputting an inverted signal of said chip select signal;
a latch circuit, receiving said write enable signal from a data terminal, for sampling said write enable signal responsive to said external clock signal and outputting an inverted signal of a sampled value;
a first logic circuit, receiving said external clock signal, an output signal of said inverter and an output signal of said latch circuit, for outputting a signal in an activated state, when said external clock signal, the output signal of said inverter and the output signal of said latch circuit being are of the second logic level;
a first signal generating circuit, receiving the output signal of said first logic circuit and said external clock signal, said first signal generating circuit activating a first set signal, based on said external clock signal, when said output signal of said first logic circuit is in an activated state, and outputting the activated first set signal; and
a set/reset circuit for setting an internal clock signal based on transition of said first set signal to an activated state and for resetting said internal clock signal based on an internal clock reset signal entered; wherein
in a cycle next following a write cycle, said write enable signal is set to a second logic level, a signal activating said internal clock signal is not activated and said cycle following said write operation is made a dummy cycle.

3. The semiconductor memory device according to claim 2, wherein said internal clock generating circuit comprises:
a second logic circuit, receiving said external clock signal, an output signal of said inverter and an output signal of said latch circuit, for outputting a signal in an activated state, when said external clock signal and the output signal of the inverter are both at a second logic level and the output signal of said latch circuit is at a first logic level;
a second signal generating circuit, receiving an output signal of said second logic circuit and said external clock signal, for activating a second set signal, based on said external clock signal, when the output signal of said second logic circuit is in an activated state and outputting the activated second set signal;
a gate control circuit for performing control to suppress transmission of said second set signal output from said second signal generating circuit, during a clock cycle next following a write cycle, based on an output signal of said latch circuit and on said external clock signal, said gate control circuit outputting, if otherwise, a second set signal output from said second signal generating circuit; and a third logic circuit, receiving an output signal of said first signal generating circuit and an output signal of said gate control circuit, said third logic circuit activating a signal for activating said internal clock signal when one of said output signals is activated to supply the activated signal to said set/reset circuit.

4. The semiconductor memory device according to claim 3, wherein said gate control circuit comprises:
a first one-shot pulse generating circuit for generating a pulse in an activated state responsive to transition of an output signal of said latch circuit from a second logic level to a first logic level;
a second one-shot pulse generating circuit for generating a pulse in an activated state responsive to transition of said external clock signal from a second logic level to a first logic level;
an SR latch circuit which is set based on activation of an output of said first one-shot pulse generating circuit and is reset based on activation of an output of said second one-shot pulse generating circuit; and
a gate circuit for controlling transmission or non-transmission of said second set signal from said second signal generating circuit, responsive to the output signal from said SR latch circuit and from said second signal generating circuit, when the output signal of said SR latch circuit is in an activated state and in a deactivated state, respectively;
said third logic circuit receiving outputs of said first signal generating circuit and said gate circuit to activate a signal for activating said internal clock signal when one of said outputs is activated to send the activated signal to said set/reset circuit.

5. The semiconductor memory device according to claim 2, wherein said first signal generating circuit comprises:
a filter for delaying the input clock signal a preset delay; and
a logic circuit for outputting the result of logic operation on an output signal of said filter and an output signal of said first logic circuit.

6. The semiconductor memory device according to claim 3, wherein said first signal generating circuit comprises:
a filter for delaying the input clock signal a preset time delay; and
a logic circuit for outputting the result of logic operation on an output signal of said filter and an output signal of said second logic circuit.

7. A semiconductor memory device comprising:
a random access memory including a plurality of memory cells; and
an internal clock generating circuit, receiving an external clock signal, for generating an internal clock signal;
said internal clock generating circuit comprising a circuit for performing control to cancel the generation of said internal clock next to a write cycle to provide a dummy cycle next to said write cycle;
wherein said semiconductor memory device carries out a precharge operation of a bit line pair connected to the memory cell selected for a write access, in said dummy cycle, said precharge operation being an operation to be performed at an end time point of said write access.

8. The semiconductor memory device according to claim 7, wherein
a read operation is carried out by one clock cycle and wherein
whether a write operation is to be carried out in a plurality of clock cycles or in one clock cycle is selectable.

9. The semiconductor memory device according to claim 8, wherein whether a write operation is to be carried out in a plurality of clock cycles or in one clock cycle is selectable by a signal supplied to an external terminal.

10. The semiconductor memory device according to claim 9, wherein whether or not a fuse has been blown off is determined based on the result of pass/fail of a wafer test for the semiconductor memory device and wherein whether a write operation is to be carried out in a plurality of clock cycles or in one clock cycle is selectable by whether or not said fuse has been blown off.

11. The semiconductor memory device according to claim 7, wherein said internal clock generating circuit, which receives the external clock signal supplied from outside the semiconductor memory device to the semiconductor memory device, to generate an internal clock signal to be supplied to said random access memory, comprises:

a circuit for canceling internal clock generation, for generating a signal activating said internal clock signal, based on said external clock signal, a chip select signal and a write enable signal, and a circuit for setting said internal clock signal based on an output of said circuit for canceling internal clock generation and for resetting said internal clock signal based on an internal clock reset signal entered;

said circuit for canceling internal clock generation setting a cycle next following a write operation as being a dummy cycle, without generating a signal activating said internal clock signal during said cycle next following the write operation.

12. The semiconductor memory device according to claim 7, wherein said internal clock generating circuit, which receives the external clock signal, supplied from outside the semiconductor memory device to the semiconductor memory device, to generate an internal clock signal to be supplied to a random access memory, comprises:

a circuit for canceling internal clock generation, said circuit for canceling internal clock generation including:

a counter for counting said external clock signal;

a circuit for detecting the activation of said write enable signal and for generating a signal for resetting said counter;

a decision circuit, receiving an output signal of said counter and an internal clock reset signal, and having an output signal deactivated by deactivation of said internal clock signal, said decision circuit having the output signal activated at a time point when said counter has counted a predetermined number of counts of said external clock signal; and a logic circuit generating a signal activating said internal clock signal, during a write operation, based on said external clock signal, chip select signal, a write enable signal and an output of said decision circuit; and a circuit for setting said internal clock signal based on an output of said circuit for canceling internal clock generation, and for resetting said internal clock signal based on said internal clock reset signal; wherein said circuit for canceling internal clock generation sets a cycle next following a write operation as being a dummy cycle, without generating a signal activating said internal clock signal during said cycle next following the write operation.

13. The semiconductor memory device according to claim 11, wherein, during said dummy cycle, said write enable signal is deactivated, and said chip select signal is activated; and wherein said circuit for canceling internal clock generation includes a circuit for suppressing generation of a signal activating said internal clock signal, which internal clock signal should otherwise be generated for use for a read operation, so that generation of said internal clock signal is prohibited during said dummy cycle.

* * * * *